(12) United States Patent
Chang et al.

(10) Patent No.: US 10,373,819 B2
(45) Date of Patent: Aug. 6, 2019

(54) METHOD FOR PROCESSING SUBSTRATE

(71) Applicant: Chunghwa Picture Tubes, LTD., Taoyuan (TW)

(72) Inventors: Hsi-Ming Chang, Taoyuan (TW); Shin-Chuan Chiang, Taipei (TW); Yen-Yu Huang, Taoyuan (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 17 days.

(21) Appl. No.: 15/886,859

(22) Filed: Feb. 2, 2018

(65) Prior Publication Data

US 2019/0148137 A1    May 16, 2019

(30) Foreign Application Priority Data

Nov. 16, 2017 (CN) .......................... 2017 1 1134321

(51) Int. Cl.
```
H01L 21/02      (2006.01)
H01L 21/67      (2006.01)
B08B 7/00       (2006.01)
```
(52) U.S. Cl.
CPC ...... *H01L 21/02101* (2013.01); *B08B 7/0021* (2013.01); *H01L 21/67023* (2013.01)

(58) Field of Classification Search
None
See application file for complete search history.

(56) References Cited

U.S. PATENT DOCUMENTS

2014/0193964 A1    7/2014    Liu et al.

FOREIGN PATENT DOCUMENTS

| JP | 2008084890 A | * | 4/2008 |
| JP | 2013163846 | | 8/2013 |
| TW | I484559 | | 5/2015 |

OTHER PUBLICATIONS

English Machine Translation of JP 2013-163846.*
English Machine Translation of JP 2008-084890.*

* cited by examiner

*Primary Examiner* — Nicole Blan
(74) *Attorney, Agent, or Firm* — JCIPRNET

(57) ABSTRACT

A processing method of a substrate is provided. The substrate is processed by a substrate processing apparatus. The substrate processing apparatus includes a reaction chamber and a secondary chamber surrounding the reaction chamber. The processing method includes: placing the substrate in the reaction chamber; performing a process to increase a pressure in the reaction chamber and a pressure in the secondary chamber, such that the pressure in the secondary chamber is between an atmospheric pressure and the pressure in the reaction chamber; increasing a temperature in the reaction chamber; and processing the substrate by a supercritical fluid in the reaction chamber.

10 Claims, 5 Drawing Sheets

METHOD FOR PROCESSING SUBSTRATE

CROSS-REFERENCE TO RELATED APPLICATION

This application claims the priority benefit of China application serial no. 201711134321.0, filed on Nov. 16, 2017. The entirety of the above-mentioned patent application is hereby incorporated by reference herein and made a part of this specification.

BACKGROUND

Field of the Invention

The invention relates to a processing method of a substrate and more particularly, to a processing method of a substrate by using a supercritical fluid.

Description of Related Art

A supercritical fluid has advantages such as high permeability and high solubility, and thus, in the semiconductor industry, the supercritical fluid is usually applied to repair semiconductor substrates with defects inside. However, as the supercritical fluid has a great critical pressure (taking supercritical $CO_2$ for example, a critical pressure of the supercritical $CO_2$ is 72.8 atm), a reaction chamber employed for containing the supercritical fluid also has to be designed to withstand a high pressure, such that a surface area of the reaction chamber has difficulty to be increased and is restricted to process only the semiconductor substrate with a small surface area. The surface area of the currently available reaction chamber is only 370 mm×470 mm.

SUMMARY

Technical Problem to be Solved

The invention provides a processing method of a substrate capable of increasing a surface area of a reaction chamber of a substrate processing apparatus.

Other objectives and advantages of the invention will be understood through the description set forth below, and the invention more will be more comprehensible through the embodiments disclosed by the invention.

Technical Solutions

The invention is directed to a processing method of a substrate, wherein the substrate is processed by a substrate processing apparatus, and the substrate processing apparatus includes a reaction chamber and a secondary chamber surrounding the reaction chamber. The processing method of the substrate includes: placing the substrate in the reaction chamber; performing a process to increase a pressure in the reaction chamber and a pressure in the secondary chamber, such that the pressure in the secondary chamber is between an atmospheric pressure and the pressure in the reaction chamber and performing at least one cycle of steps which include increasing the pressure in the reaction chamber by supplying a supercritical fluid and a reaction material into the reaction chamber and increasing the pressure in the secondary chamber; increasing a temperature in the reaction chamber; and processing the substrate by using the supercritical fluid in the reaction chamber.

According to an embodiment of the invention, the substrate processing apparatus further includes a reaction chamber supply port and a reaction chamber discharge port which are respectively connected with the reaction chamber; and a secondary chamber supply port and a secondary chamber discharge port which are respectively connected with the secondary chamber.

According to an embodiment of the invention, the supercritical fluid and the reaction material pass through the reaction chamber supply port to be supplied into the reaction chamber.

According to an embodiment of the invention, air is supplied into the secondary chamber through the secondary chamber supply port to increase the pressure in the secondary chamber.

According to an embodiment of the invention, after the substrate is processed by using the supercritical fluid in the reaction chamber, the processing method of the substrate further includes: reducing the temperature in the reaction chamber; reducing the pressure in the reaction chamber and the pressure in the secondary chamber; and taking the processed substrate out of the reaction chamber.

According to an embodiment of the invention, the remaining supercritical fluid and the remaining reaction material are discharged from the reaction chamber to reduce the pressure in the reaction chamber.

According to an embodiment of the invention, the pressure in the reaction chamber is kept greater than the pressure in the secondary chamber during the process of reducing the pressure in the reaction chamber and the pressure in the secondary chamber.

According to an embodiment of the invention, after the process of increasing the pressure in the reaction chamber and the pressure in the secondary chamber is performed, the pressure in the secondary chamber is between ¼ of the pressure in the reaction chamber and ¾ of the pressure in the reaction chamber.

According to an embodiment of the invention, the number of the reaction chamber is plural.

According to an embodiment of the invention, the number of the secondary chamber is plural.

Beneficial Effects

The invention can achieve increasing the surface area of the reaction chamber through disposing the secondary chamber surrounding the reaction chamber in the substrate processing apparatus and controlling a pressure difference between the reaction chamber and the secondary chamber. The invention can achieve processing the substrate with defects in a greater surface area by using the substrate processing apparatus and the operational conditions thereof, thereby enhancing applicability of the substrate processing apparatus.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
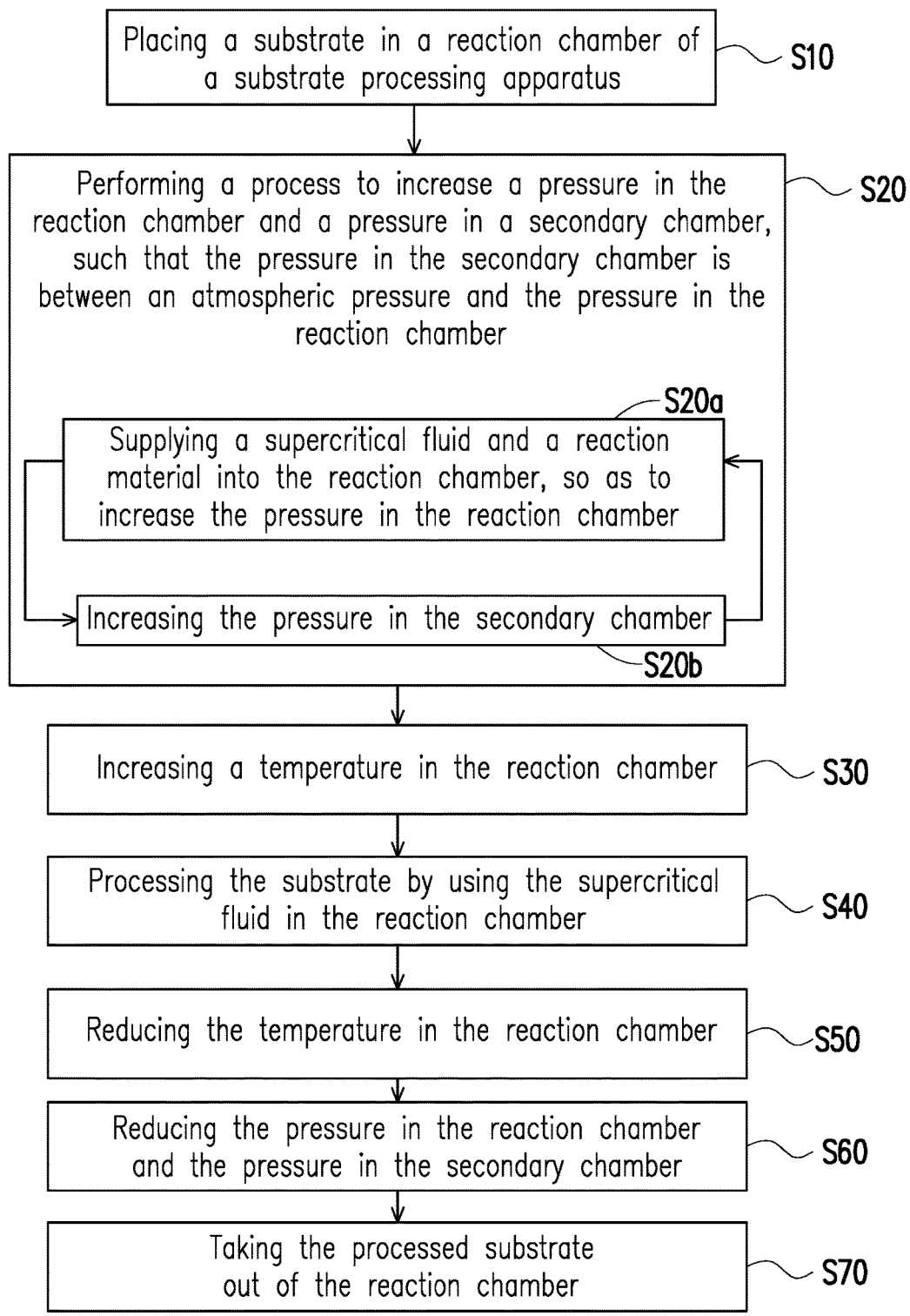
FIG. 1 is a flowchart of a processing method of a substrate according to an embodiment of the invention.

Reference will now be made in detail to the exemplary embodiments of the disclosure, examples of which are illustrated in the accompanying drawings. Wherever possible, the same reference numbers are used in the drawings and the description to refer to the same or like parts.

Figure 2:
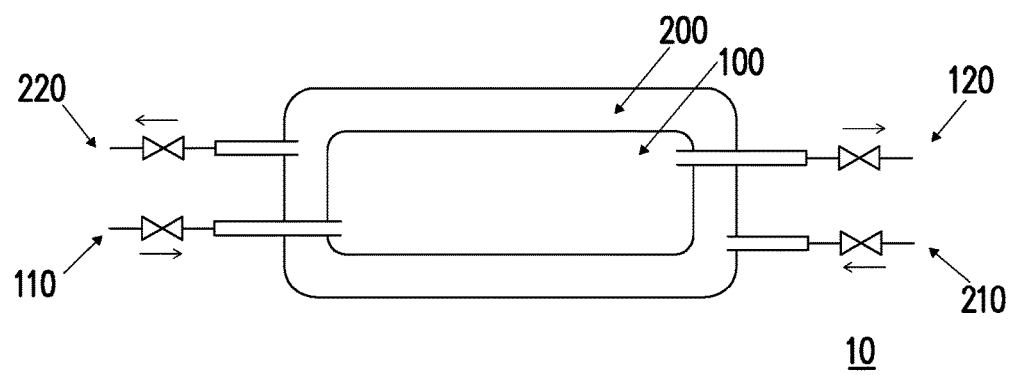
FIG. 2 is a cross-sectional diagram of a substrate processing apparatus according to an embodiment of the invention.

FIG. 1 is a flowchart of a processing method of a substrate according to an embodiment of the invention. FIG. 2 is a cross-sectional diagram of a substrate processing apparatus according to an embodiment of the invention.

Referring to FIG. 1 and FIG. 2 simultaneously, in step S10, a substrate (which is not shown) is placed in a reaction chamber 100 of a substrate processing apparatus 10. The substrate processing apparatus 10 of the invention may include the reaction chamber 100, a secondary chamber 200, a reaction chamber supply port 110, a reaction chamber discharge port 120, a secondary chamber supply port 210 and a secondary chamber discharge port 220. The reaction chamber 100 may be configured to accommodate a substrate (which is not shown) with defects and may be configured to at least withstand a critical temperature and a critical pressure of a supercritical fluid used thereby. The substrate may be, for example, a thin film transistor array substrate to be processed, which is not limited in the invention. The secondary chamber 200 is disposed to surround the reaction chamber 100. The reaction chamber supply port 110 and the reaction chamber discharge port 120 are connected with the reaction chamber 100. The secondary chamber supply port 210 and the secondary chamber discharge port 220 are connected with the secondary chamber 200.

In step S20, a process to increase a pressure in the reaction chamber 100 and a pressure in the secondary chamber 200 is preformed, such that a pressure $P_c$ in the secondary chamber 200 is between 1 atm and a pressure $P_R$ in the reaction chamber 100. Step S20 includes steps S20a and S20b which are performed for at least one cycle. In step S20a, a supercritical fluid and a reaction material are supplied into the reaction chamber 100, so as to increase the pressure $P_R$ in the reaction chamber 100. In step S20b, the pressure $P_c$ in the secondary chamber 200 is increased. The supercritical fluid and the reaction material are supplied into the reaction chamber 100 through the reaction chamber supply port 110. The supercritical fluid may be, for example, supercritical $CO_2$, but the invention is not limited thereto. The reaction material may be, for example, $H_2O$, $H_2O_2$ or a combination thereof, but the invention is not limited thereto.

As the supercritical fluid has a characteristic of high solubility, a trace of the reaction material may be dissolved in the supercritical fluid. Further, with high permeability of the supercritical fluid, the supercritical fluid carried with the reaction material may enter defect structure of the substrate, for example, a dangling bond, thereby bonding the reaction material and the dangling bond to vanish the dangling bond. The pressure $P_c$ in the secondary chamber 200 may be increased by, for example, injecting air into the secondary chamber 200 through the secondary chamber supply port 210, but the invention is not limited thereto.

During the process of performing the process of increasing the pressure in the reaction chamber 100 and the pressure in the secondary chamber 200, the pressure $P_R$ in the reaction chamber 100 is kept greater than the pressure $P_c$ in the secondary chamber 200 all the time, i.e., $P_R > P_c > 1$ atm. A pressure difference (i.e., $(P_R - P_c)$) between the reaction chamber 100 and the secondary chamber 200 may be ensured to be a positive value by keeping the pressure $P_R$ in the reaction chamber 100 greater than the pressure $P_c$ in the secondary chamber 200 all the time, thereby preventing the substrate in the reaction chamber 100 from being polluted due to a gas in the secondary chamber 200 entering the reaction chamber 100 because of the occurrence of the pressure difference. Meanwhile, when a relationship between the pressure $P_R$ in the reaction chamber 100 and the pressure $P_c$ in the secondary chamber 200 is in the aforementioned condition, a pressure difference between the reaction chamber and the surrounding may be reduced when the substrate processing apparatus is in operation (in comparison with the current substrate processing apparatus, i.e., $(P_R - P_c) < (P_R - 1 \text{ atm})$), and therefore, a reaction chamber having a greater surface area may be designed for processing a substrate with a great surface area. Preferably, the relationship between the pressure $P_R$ in the reaction chamber 100 and pressure $P_c$ in the secondary chamber 200 may be controlled to satisfy a formula, $\frac{3}{4} P_R > P_c > \frac{1}{4} P_R$, and more preferably, satisfy a formula $P_R \approx P_c$ in the present embodiment. When steps S20a and S20b are repeatedly performed for at least one cycle to cause the pressure $P_R$ in the reaction chamber 100 to be at least greater than the critical pressure of the supercritical fluid, the supercritical fluid and the reaction material are stopped from being supplied into the reaction chamber 100. For example, in an embodiment, supercritical $CO_2$ is selected as the supercritical fluid. As a critical pressure of the supercritical $CO_2$ is 72.8 atm, the pressure $P_R$ in the reaction chamber 100 has to be at least greater than 72.8 atm. In the present embodiment, the pressure $P_R$ in the reaction chamber 100 may be preferably controlled to satisfy a formula, 72.8 atm $< P_R <$ 300 atm.

In step S30, a temperature $T_R$ in the reaction chamber 100 is increased. The temperature $T_R$ in the reaction chamber 100 may be increased through, for example, heating the reaction chamber 100 by a heater (which is not shown) disposed inside or outside of the substrate processing apparatus 10, such that the temperature $T_R$ in the reaction chamber 100 may be at least greater than the critical temperature of the supercritical fluid, which is not limited in the invention. For example, in an embodiment, supercritical $CO_2$ is selected as the supercritical fluid. As the critical temperature of the supercritical $CO_2$ is 31.7° C., the temperature $T_R$ in the reaction chamber 100 has to be at least greater than 31.7° C. In the present embodiment, the temperature $T_R$ in the reaction chamber 100 may be preferably controlled to satisfy a formula, 31.7° C. $< T_R <$ 200° C.

In step S40, the substrate is processed by using the supercritical fluid in the reaction chamber 100. After the pressure and the temperature in the reaction chamber are respectively controlled to reach the critical pressure and the critical temperature of the supercritical fluid, the substrate processing apparatus 10 is operated to process the substrate by using the supercritical fluid. For example, in an embodiment, supercritical $CO_2$ is selected as the supercritical fluid. For example, the substrate may be processed by using the supercritical $CO_2$ in the reaction chamber 100 for 1 minute (min) to 100 min. Preferably, the substrate may be processed by using the supercritical $CO_2$ in the reaction chamber 100 for 3 min to 30 min.

In step S50, the temperature $T_R$ in the reaction chamber 100 is reduced. After the substrate is processed by using the supercritical fluid, the temperature $T_R$ in the reaction chamber 100 may be reduced down to a temperature for taking out the substrate. For example, in an embodiment, supercritical $CO_2$ is selected as the supercritical fluid. The substrate may be taken out after the temperature $T_R$ in the reaction chamber 100 is reduced down to 60° C. to 80° C.

In step S60, the pressure in the reaction chamber 100 and the pressure in the secondary chamber 200 are reduced. The pressure $P_R$ in the reaction chamber 100 may be reduced by, for example, discharging the remaining supercritical fluid and the remaining reaction material through the reaction chamber discharge port 120. The pressure $P_c$ in the secondary chamber 200 may be reduced by, for example, discharging the air through the secondary chamber discharge port 220. During the process of reducing the pressure $P_R$ in the reaction chamber 100 and the pressure $P_c$ in the secondary chamber 200, the pressure $P_R$ in the reaction chamber 100 is kept greater than the pressure $P_c$ in the secondary chamber 200 all the time, i.e., $P_R > P_c > 1$ atm. The pressure difference between the reaction chamber 100 and the secondary chamber 200 may be ensured to be a positive value by keeping the pressure $P_R$ in the reaction chamber 100 greater than the pressure $P_c$ in the secondary chamber 200 all the time, thereby preventing the substrate in the reaction chamber 100 from being polluted due to a gas in the secondary chamber 200 entering the reaction chamber 100 because of the occurrence of the pressure difference. Preferably, the relationship between the pressure $P_R$ in the reaction chamber 100 and the pressure $P_c$ in the secondary chamber 200 may be controlled to satisfy a formula, $3/4 P_R > P_c > 1/4 P_R$, and more preferably, satisfy a formula, $P_R \approx 2 P_c$ in the present embodiment.

In step S70, the processed substrate is taken out of the reaction chamber 100. When the pressure in the reaction chamber 100 and the pressure in the secondary chamber 200 are reduced down to 1 atm, the processed substrate may be taken out of the reaction chamber 100.

The invention can achieve increasing the surface area of the reaction chamber 100 through disposing the secondary chamber 200 surrounding the reaction chamber 100 in the substrate processing apparatus 10 and controlling the pressure difference ($P_R - P_c$) between the reaction chamber 100 and the secondary chamber 200. The invention can achieve processing the substrate with defects in a greater area by using the substrate processing apparatus 10 and the operational conditions thereof, thereby enhancing applicability of the substrate processing apparatus 10.

Figure 3:
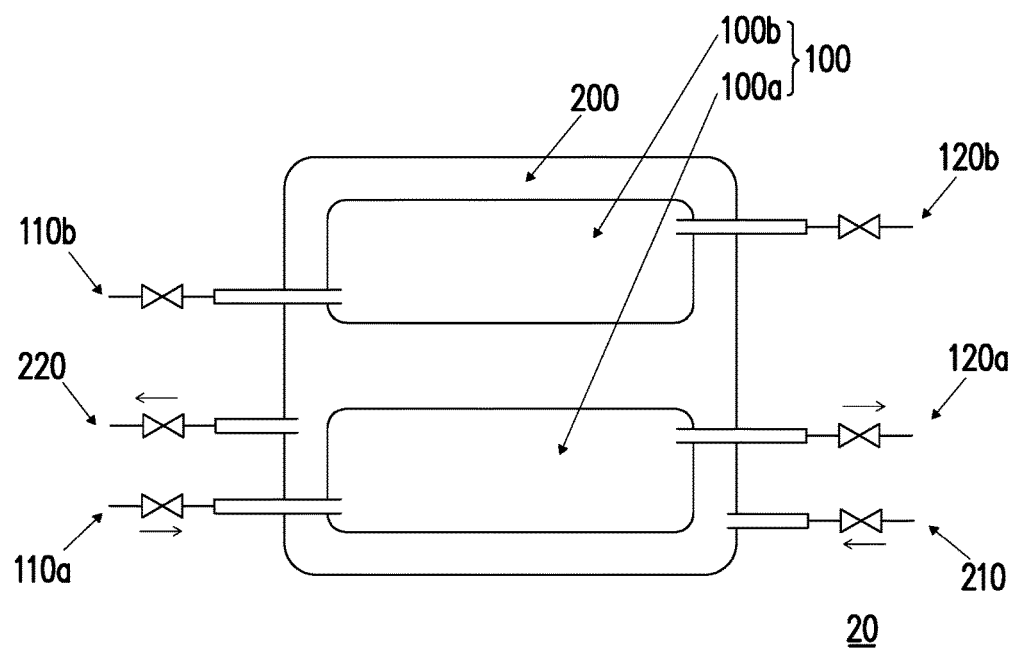
FIG. 3 is a cross-sectional diagram of a substrate processing apparatus according to another embodiment of the invention.

FIG. 3 is a cross-sectional diagram of a substrate processing apparatus according to another embodiment of the invention.

Referring to FIG. 3, the number of the reaction chamber 100 of a substrate processing apparatus 20 in the present embodiment may be two, namely, the reaction chamber 100 includes a first reaction chamber 100a and a second reaction chamber 100b, which is not limited in the invention. That is, the number of the reaction chamber 100 in the substrate processing apparatus 20 of the invention may be two or more. Correspondingly, in the present embodiment, a reaction chamber supply port 110a and a reaction chamber discharge port 120a which are connected with the first reaction chamber 100a and a reaction chamber supply port 110b and a reaction chamber discharge port 120b which are connected with the second reaction chamber 100b are disposed. In case the number of the reaction chamber 100 in the substrate processing apparatus 20 of the invention is plural, an efficiency of processing the substrate can be enhanced.

Figure 4:
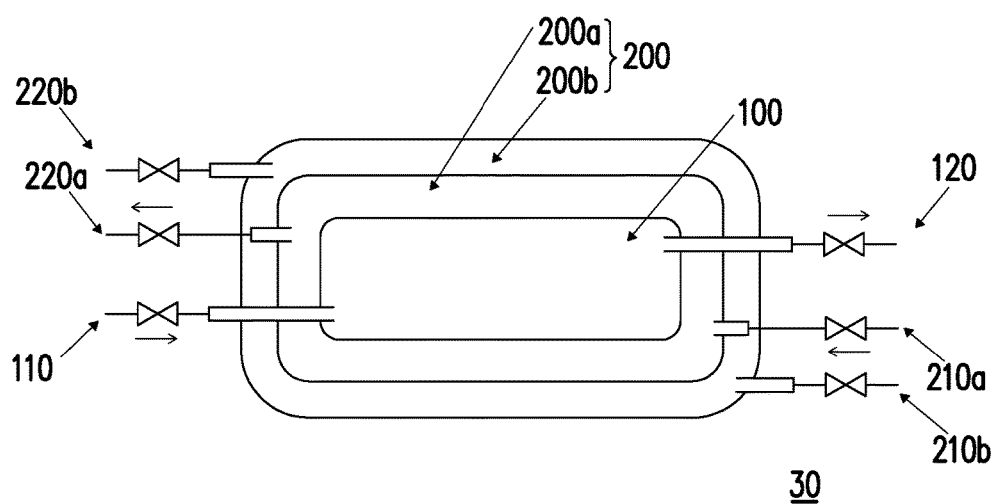
FIG. 4 is a cross-sectional diagram of a substrate processing apparatus according to yet another embodiment of the invention.

FIG. 4 is a cross-sectional diagram of a substrate processing apparatus according to yet another embodiment of the invention.

Referring to FIG. 4 the number of the secondary chamber 200 of a substrate processing apparatus 30 in the present embodiment may be two, namely, the secondary chamber 200 includes a first secondary chamber 200a and a second secondary chamber 200b, which is not limited in the invention. That is, the number of the secondary chamber 200 in the substrate processing apparatus 30 of the invention may be two or more. Correspondingly, in the present embodiment, a secondary chamber supply port 210a and a secondary chamber discharge port 220a which are connected with the first secondary chamber 200a and a secondary chamber supply port 210b and a secondary chamber discharge port 220b which are connected with the second secondary chamber 200b are disposed. In case the number of the secondary chamber 200 in the substrate processing apparatus 30 of the invention is plural, the pressure difference between the secondary chamber 200 and the reaction chamber 100 can be further reduced. Taking the substrate processing apparatus 30 illustrated in FIG. 4 as an example, a relationship between the first secondary chamber 200a and the reaction chamber 100 may be controlled to satisfy a formula, $2 P_R \approx 3 P_c$.

Figure 5:
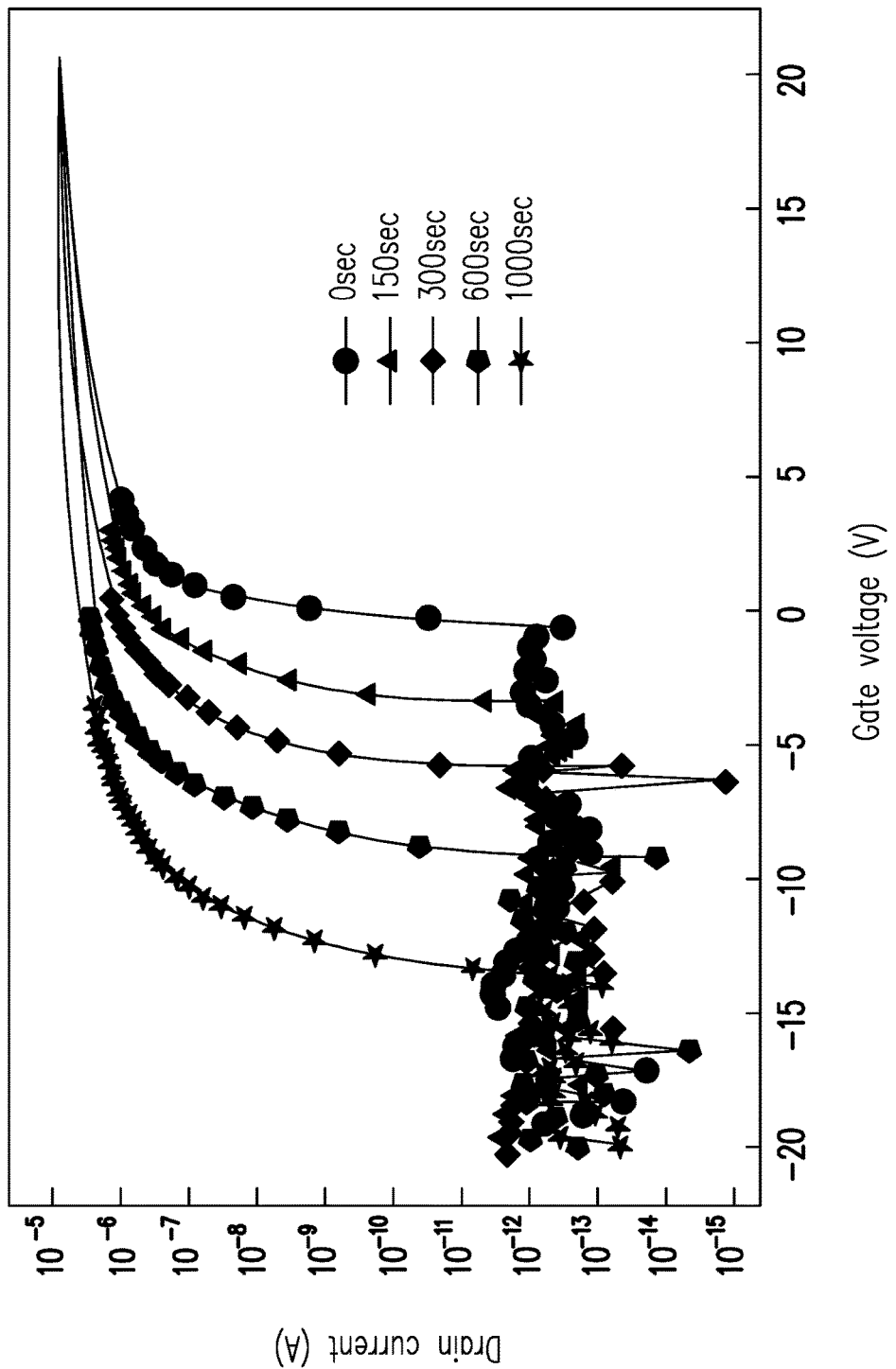
FIG. 5 is a diagram of a relationship between drain currents and gate voltages for an unprocessed thin film transistor array substrate with defects according to the invention.
Figure 6:
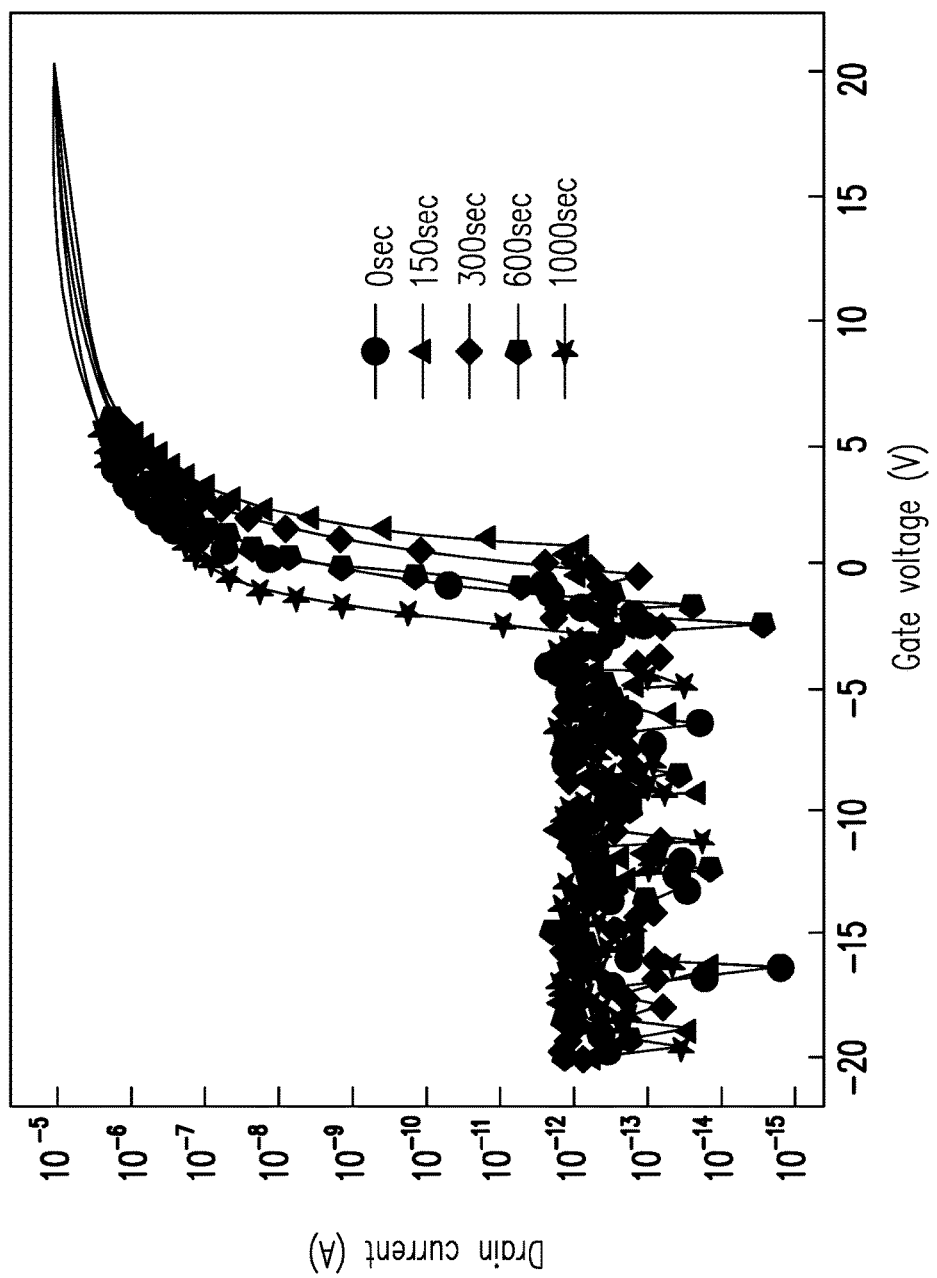
FIG. 6 is a diagram of a relationship between drain currents and gate voltages for a thin film transistor array substrate with defects which is processed by using the supercritical fluid according to the invention.

FIG. 5 is a diagram of a relationship between drain currents and gate voltages for an unprocessed thin film transistor array substrate with defects according to the invention. FIG. 6 is a diagram of a relationship between drain currents and gate voltages for a thin film transistor array substrate with defects which is processed by using the supercritical fluid according to the invention.

Referring to FIG. 5 and FIG. 6 simultaneously, in the present experiment example, a transistor array substrate is processed by the substrate processing apparatus 10 of the invention. First, it may be observed that a critical voltage of a thin film transistors including the thin film transistor array substrate with defects is dropped by about 15 V after the thin film transistor is operated for 1000 seconds (sec). Then, it may be observed that the critical voltage of the thin film transistor including the thin film transistor array substrate processed by the substrate processing apparatus 10 of the invention is only dropped by 5V after the thin film transistor is operated for 1000 sec. Namely, the substrate processing apparatus 10 may be implementable. Meanwhile, the substrate processing apparatus 10 of the invention may be employed to process a substrate surface area up to 730 mm×920 mm, which significantly enhance the applicability of the substrate processing apparatus 10.

The embodiments provided above are only for a purpose of demonstrating the invention, instead of limiting the scope of the disclosure. Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A processing method of a substrate, wherein the substrate is processed by a substrate processing apparatus, and the substrate processing apparatus comprises a reaction chamber and a secondary chamber surrounding the reaction chamber, the method comprising:
    placing the substrate in the reaction chamber;
    performing a process to increase a pressure in the reaction chamber and a pressure in the secondary chamber, such that the pressure in the secondary chamber is between an atmospheric pressure and the pressure in the reaction chamber and performing at least one cycle of steps which comprise:
        supplying a supercritical fluid and a reaction material into the reaction chamber, so as to increase the pressure in the reaction chamber; and
        increasing the pressure in the secondary chamber;
    increasing a temperature in the reaction chamber; and
    processing the substrate by using the supercritical fluid in the reaction chamber.

2. The processing method according to claim 1, wherein the substrate processing apparatus further comprises:
    a reaction chamber supply port and a reaction chamber discharge port which are respectively connected with the reaction chamber; and
    a secondary chamber supply port and a secondary chamber discharge port which are respectively connected with the secondary chamber.

3. The processing method according to claim 2, wherein the supercritical fluid and the reaction material pass through the reaction chamber supply port to be supplied into the reaction chamber.

4. The processing method according to claim 2, wherein air is supplied into the secondary chamber through the secondary chamber supply port to increase the pressure in the secondary chamber.

5. The processing method according to claim 1, wherein after the step of processing the substrate by using the supercritical fluid in the reaction chamber, the method further comprises:
    reducing the temperature in the reaction chamber;
    reducing the pressure in the reaction chamber and the pressure in the secondary chamber; and
    taking the processed substrate out of the reaction chamber.

6. The processing method according to claim 5, wherein the remaining supercritical fluid and the remaining reaction material are discharged from the reaction chamber to reduce the pressure in the reaction chamber.

7. The processing method according to claim 5, wherein the pressure in the reaction chamber is kept greater than the pressure in the secondary chamber during the process of reducing the pressure in the reaction chamber and the pressure in the secondary chamber.

8. The processing method according to claim 1, wherein after the process of increasing the pressure in the reaction chamber and the pressure in the secondary chamber is performed, the pressure in the secondary chamber is between ¼ of the pressure in the reaction chamber and ¾ of the pressure in the reaction chamber.

9. The processing method according to claim 1, wherein the number of the reaction chamber is plural.

10. The processing method according to claim 1, wherein the number of the secondary chamber is plural.

* * * * *